US008663590B2

(12) United States Patent
Kawano

(10) Patent No.: US 8,663,590 B2
(45) Date of Patent: Mar. 4, 2014

(54) CARBONATE AND METHOD FOR PRODUCING THE SAME

(75) Inventor: Tetsuo Kawano, Ashigarakami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 1065 days.

(21) Appl. No.: 12/078,562

(22) Filed: Apr. 1, 2008

(65) Prior Publication Data

US 2008/0247937 A1    Oct. 9, 2008

(30) Foreign Application Priority Data

Apr. 3, 2007    (JP) .................................. 2007-097783

(51) Int. Cl.
*C01F 5/24*    (2006.01)
(52) U.S. Cl.
USPC ........ 423/432; 423/414; 423/415; 423/419.1; 423/430
(58) Field of Classification Search
USPC ...................... 423/419.1, 430, 432
See application file for complete search history.

(56) References Cited

U.S. PATENT DOCUMENTS

| 5,164,172 A | 11/1992 | Katayama et al. |
| 2005/0255027 A1* | 11/2005 | Hirai et al. ................. 423/430 |

FOREIGN PATENT DOCUMENTS

| JP | 59-203728 A | 11/1984 |
| JP | 8-2914 A | 1/1996 |
| JP | 2006-021987 | 1/2006 |
| JP | 2008-222514 | 9/2008 |
| JP | 2009-001475 | 1/2009 |
| WO | WO 01/25364 A1 | 4/2001 |

OTHER PUBLICATIONS

JP2006021987, english translation, Jan. 2006, Tetsuo, Kono.*
Donnet et al (NPL: "Use of seeds to control precipitation of calcium carbonate and determination of seed nature", Langmuir 2005, vol. 21 pp. 100-108).*
Marcel Donnet et al., "Use of Seeds to Control Precipitation of Calcium Carbonate and Determination of Seed Nature", Langmuir 2005, 21, pp. 100-108.
Ivan Sondi et al., "Homogeneous Precipitation by Enzyme-Catalyzed Reactions. 2. Strontium and Barium Carbonates", Chem. Mater. 2003, 15, pp. 1322-1326.
Notification of Reasons for Refusal issued in corresponding Japanese Patent Application No. 2007-097783 dated Sep. 25, 2012.

* cited by examiner

*Primary Examiner* — Melvin C Mayes
*Assistant Examiner* — Smita Patel
(74) *Attorney, Agent, or Firm* — Buchanan Ingersoll & Rooney PC

(57) ABSTRACT

To provide a method for producing a carbonate, including: growing seed crystals, wherein the seed crystals are grown in a reaction solution containing at least urea. An aspect in which the seed crystals are strontium carbonate particles, an aspect in which the reaction solution contains a metal ion source and the metal ion source is a hydroxide of strontium, and the like are favorable.

3 Claims, 6 Drawing Sheets

At a 1,000-fold magnification

50 μm

At a 1,000-fold magnification

50 μm

At a 10,000-fold magnification

5 μm

At a 1,000-fold magnification

50 μm

At a 10,000-fold magnification

At a 1,000-fold magnification

CARBONATE AND METHOD FOR PRODUCING THE SAME

BACKGROUND OF THE INVENTION

1. Field of the Invention

The present invention relates to a method for producing a carbonate, in which the carbonate offering orientation birefringence and being formed from needle-shaped or rod-shaped particles can be efficiently provided, and in which the particle size of the carbonate can be controlled.

2. Description of the Related Art

Conventionally, carbonates (e.g. strontium carbonate) have been widely used in the fields of rubber, plastic, paper and the like. In recent years, high-performance carbonates have been developed one after another and widely used for many purposes according to their specific features such as particle shape and particle diameter.

Examples of the crystalline forms of carbonate include calcite, aragonite and vaterite. Amongst these, aragonite is useful in a variety of applications because it is formed from needle-shaped particles and is therefore superior in strength and elastic modulus.

As methods for producing carbonates, a method in which a carbonate ion-containing solution is made to react with a chloride-containing solution to produce a carbonate and a method in which a chloride is made to react with carbonic acid gas to produce a carbonate are generally known, for example. As methods for producing needle-shaped carbonates with an aragonite structure, the following methods have been proposed, for example: a method in which a carbonate ion-containing solution is made to react with a chloride-containing solution while an ultrasonic wave is applied in the aforementioned method (refer to Japanese Patent Application Laid-Open (JP-A) No. 59-203728), a method in which needle-shaped aragonite crystals as seed crystals are previously added into an aqueous slurry of $Ca(OH)_2$ and the seed crystals are grown only in a predetermined direction in a process of introducing carbon dioxide into the aqueous slurry of $Ca(OH)_2$ (refer to U.S. Pat. No. 5,164,172), and a method in which sodium aluminate is added to a calcium hydroxide slurry, then the mixture is heated to a temperature of 50° C. or higher, and carbonic acid gas is blown onto the mixture (refer to JP-A No. 08-2914).

However, the method for producing a carbonate disclosed in JP-A No. 59-203728 presents a problem in which not only is the obtained carbonate formed of large particles of 30 µm to 60 µm in length but also the particle size distribution is wide, thereby making it impossible to obtain a carbonate having a desired, controlled particle size. Also, the method for producing a carbonate disclosed in U.S. Pat. No. 5,164,172 merely makes it possible to obtain large particles of 20 µm to 30 µm in length. Meanwhile, the method for producing a carbonate disclosed in JP-A No. 08-2914 requires that heating be controlled in a production step.

Incidentally, there has been a strong tendency in recent years that polymer resins are used as materials for general optical components (e.g. lenses for eyeglasses, and transparent plates) and optical components designed for optoelectronics, particularly optical components used in laser-related devices such as optical disc devices for recording sound, pictures, textual information, etc. One of the reasons for this is that optical polymer materials (optical materials made of polymer resin) are generally light, inexpensive and excellent in formability and productivity, as compared with other optical materials (e.g. optical glasses). In addition, polymer resins are advantageous in that molding techniques, such as injection molding and extrusion molding, can be readily applied.

However, it has been known that when conventional optical polymer materials are subjected to any of the molding techniques for the purpose of commercialization, the obtained products exhibits birefringence. Although birefringent optical polymer materials are not particularly problematic when used in optical elements which do not require very high optical precision, there has been an increased demand in recent years for higher-precision optical articles. For example, birefringence causes a serious problem in rewritable magneto optical discs. Specifically, since any such magneto optical disc utilizes a polarized beam as a reading or writing beam, the presence of a birefringent optical element (e.g. the disk itself or a lens) in an optical path has a negative effect on precision of reading or writing.

Accordingly, a non-birefringent optical resin material formed from a polymer resin and fine inorganic particles, the birefringence values of which are opposed to each other in sign, has been proposed for the purpose of reducing the degree of birefringence (refer to International Publication No. WO 01/25364). The optical resin material is prepared by a process referred to as "crystal doping". Specifically, a large number of fine inorganic particles are dispersed in polymer resin, a molding force is externally applied by means of drawing or the like, allowing linking chains present in the polymer resin and the fine inorganic particles to align substantially parallel to each other, and the birefringence brought about by the alignment of the linking chains of the polymer resin is offset by the birefringence of the fine inorganic particles that has a value of the opposite sign.

As described above, in order to obtain a non-birefringent optical resin material by means of crystal doping, fine inorganic particles which are available for the crystal doping are essential. Here, it is recognized that fine needle-shaped or rod-shaped carbonate particles can be particularly suitably used as these fine inorganic particles.

Against the background of these circumstances, a number of approaches have been taken to control sizes and forms of the fine inorganic particles; however, a problem of large variance of particle sizes remains unsolved. Moreover, in conventional synthesis methods, obtained particles have poor crystallinity, and thus it is feared that optical properties (birefringence of particles) may be degraded.

To solve these problems, a method is described in Langmuir, 2005, vol. 21(1), pp. 100 to 108, in which nanosized seed crystals (calcium carbonate) are produced using PAA (polyacrylic acid), and calcium carbonate particles are obtained using these nanosized seed crystals. The study indicates a fact that in some cases a crystal type of calcium carbonate (there are three crystal types as to calcium carbonate, namely calcite, vaterite, and aragonite) can be controlled by selecting seed crystals of the desired crystal type; however, obtained particles are mostly shaped like spindles, spheres or the like, and it should be particularly noted that particles having a large aspect ratio have not yet been obtained.

Meanwhile, Chem Mater. 2003, vol. 15(6), pp. 1,322 to 1,326 describes a method in which carbonate particles are formed by a decomposition reaction of urea (thermal decomposition or enzymatic decomposition using urease) in a solution containing strontium salt or barium salt and urea. In terms of the decomposition rate of urea, enzymatic decomposition proceeds faster than thermal decomposition and is preferable; however, thermal decomposition is preferable in some cases in terms of reduction of impurities.

Since the thermal decomposition of urea proceeds slowly, numbers of cores produced become small. Although needle-shaped particles having a large aspect ratio can be obtained, the particles are large in size (see FIG. 1c in this literature). Meanwhile, in the case where urea decomposition is conducted using an enzyme, particles are formed into the shape of spheres, and the enzyme (protein) is contained in the particles, so that when such particles are introduced into a final material, there arises a concern over contamination, etc.

BRIEF SUMMARY OF THE INVENTION

An object of the present invention is to provide a method for producing a carbonate, wherein the size and distribution of carbonate particles growing in the direction of a c-axis can be controlled by using seed crystals and controlling the concentration (number) of the carbonate particles serving as the seed crystals.

Another object of the present invention is to provide a carbonate having high crystallinity, as the present invention utilizes generation of carbonate ions effected by means of a decomposition reaction of urea, which allows carbonate particles to grow slowly.

The following are means for solving the problems.

<1> A method for producing a carbonate, including: growing seed crystals, wherein the seed crystals are grown in a reaction solution containing at least urea.

<2> The method for producing a carbonate according to <1>, wherein the seed crystals are strontium carbonate particles.

<3> The method for producing a carbonate according to <1>, wherein the reaction solution contains a metal ion source, and the metal ion source is a hydroxide of strontium.

<4> The method for producing a carbonate according to <1>, wherein the step of growing the seed crystals is carried out at 55° C. to 95° C.

<5> The method for producing a carbonate according to <1>, wherein the step of growing the seed crystals is carried out at a pH of 10 or greater throughout.

<6> A carbonate produced by a method for producing a carbonate, the method including: growing seed crystals, wherein the seed crystals are grown in a reaction solution containing at least urea.

<7> The carbonate according to <6>, wherein the carbonate has an average aspect ratio of 2 or greater and an average major axis of 5 μm or less.

<8> The carbonate according to <6>, wherein the carbonate is formed from strontium carbonate particles.

The present invention's method for producing a carbonate includes a step of growing seed crystals, wherein the seed crystals are grown in a reaction solution containing at least urea. Consequently, urea is used as a carbonate source, and the carbonate source and metal ions are consumed to help grow the seed crystals that are already present, before cores are spontaneously produced, in the presence of the seed crystals. Therefore, a high yield can be obtained in a shorter period of time, and the size distribution can be made narrower than in the case where seed crystals are not used.

According to the present invention, it is possible to solve the above-mentioned problems in related art and to obtain strontium carbonate particles with high crystallinity by using seed crystal particles and controlling the concentration (number) of these particles, which enables the average size of particles growing in the c-axis direction to be controlled.

Also according to the present invention, by conducting a thermal decomposition reaction of urea under a highly alkaline condition to promote the decomposition reaction, it is possible to remove a phenomenon in which simple use of urea in a growing process of seed crystals makes a thermal decomposition reaction of urea proceed slowly and requires a great deal of time until metal ions in a reaction solution are completely consumed, and to achieve a high yield.

Figure 1A:
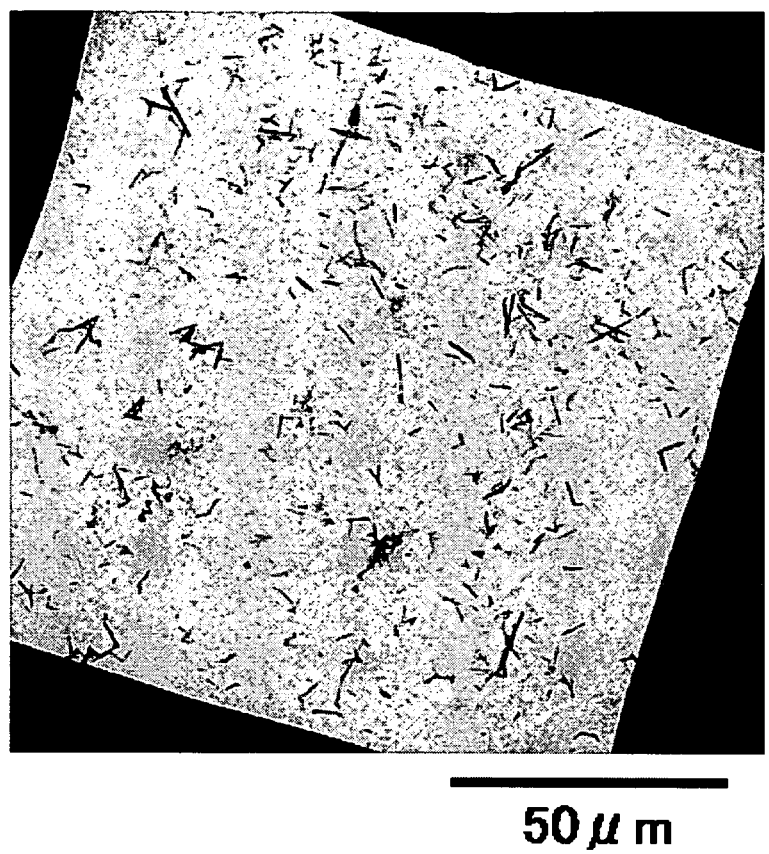
FIG. 1A is a TEM picture (at a 1,000-fold magnification) of a strontium carbonate produced in Example 1.

DETAILED DESCRIPTION OF THE INVENTION (Method for Producing Carbonate)
The present invention's method for producing a carbonate includes a step of growing seed crystals and includes other steps according to necessity.
<Step of Growing Seed Crystal>
The step of growing seed crystals is a process in which urea is used as a carbonate source and seed crystals are grown in a reaction solution containing a metal ion source.
—Seed Crystal—
The shape, size, material and production method of the seed crystals are not particularly limited and can be suitably selected according to the purpose. It is desirable that the material for the seed crystals be one selected, for example, from strontium carbonate particles, calcium carbonate particles, barium carbonate particles, zinc carbonate particles and lead carbonate particles, with strontium carbonate particles being particularly preferable.

Examples of the shape of the seed crystals include spherical shape, elliptical shape, needle-like shape, rod-like shape and indefinite shapes, with spherical shape being particularly preferable in that the seed crystals can be easily reduced in size.

It is advisable to select the size (particle diameter) of the seed crystals according to the final particle size intended.

The method for producing the seed crystals is not particularly limited and can be suitably selected from ordinary methods for producing carbonate according to the purpose. Examples thereof include: (1) a method of effecting reaction between a metal ion source and a carbonate source at a low temperature in a reaction solution by using a double-jet reactor (multiple addition apparatus) or the like, and (2) a method of placing a metal ion source-containing solution including alcohol and water in an enclosed space and supplying a carbonate source thereto. Note that the seed crystals can be selected from commercially-supplied products.
—Metal Ion Source—
The metal ion source is not particularly limited and can be suitably selected according to the purpose, as long as it contains a metal ion. Nevertheless, those capable of reacting with the carbonate source to form carbonates having a calcite crystal structure, aragonite crystal structure, vaterite crystal structure or amorphous crystal structure are preferable, with those capable of forming carbonates having an aragonite crystal structure being particularly preferable.

The aragonite crystal structure is represented by $CO_3^{2-}$ units, and the $CO_3^{2-}$ units are layered to constitute a carbonate formed from needle-shaped or rod-shaped particles. Thus, when the carbonate is drawn in one given direction by a drawing process described below, crystals are arrayed such that the major axis direction of carbonate particles corresponds with the drawing direction.

Table 1 shows refractive indexes of minerals in an aragonite crystal form. As shown in Table 1, since carbonates having the aragonite crystal structure are large in birefringent index δ, they can be suitably used for doping to polymers having orientation birefringence.

TABLE 1

|  | α | β | γ | δ | Specific Gravity |
|---|---|---|---|---|---|
| $CaCO_3$ | 1.530 | 1.681 | 1.685 | 0.155 | 2.94 |
| $SrCO_3$ | 1.520 | 1.667 | 1.669 | 0.149 | 3.75 |
| $BaCO_3$ | 1.529 | 1.676 | 1.677 | 0.148 | 4.29 |
| $PbCO_3$ | 1.804 | 2.076 | 2.078 | 0.274 | 6.55 |

The metal ion source is not particularly limited and can be suitably selected according to the purpose, as long as it contains at least one metal ion selected from the group consisting of $Sr^{2+}$ ion, $Ca^{2+}$ ion, $Ba^{2+}$ ion, $Zn^{2+}$ ion and $Pb^{2+}$ ion. Examples thereof include nitrates, chlorides and hydroxides of at least one metal selected from Sr, Ca, Ba, Zn and Pb; and hydrates thereof.

Amongst these, hydroxides of at least one metal selected from strontium, calcium, barium, zinc and lead are preferable, with hydroxides of strontium being particularly preferable.

The metal ion source preferably includes at least any one of $NO_3^-$, $Cl^-$ and $OH^-$. Therefore, specific examples of the metal ion source include $Sr(NO_3)_2$, $Ca(NO_3)_2$, $Ba(NO_3)_2$, $Zn(NO_3)_2$, $Pb(NO_3)_2$, $SrCl_2$, $CaCl_2$, $BaCl_2$, $ZnCl_2$, $PbCl_2$, $Sr(OH)_2$, $Ca(OH)_2$, $Ba(OH)_2$, $Zn(OH)_2$, $Pb(OH)_2$, and hydrates thereof.

When strontium carbonate is produced, $Sr(OH)_2 \cdot 8H_2O$ is particularly preferable as a metal ion source.

—Carbonate Source—

Urea [$(NH_2)_2CO$] is used for the carbonate source. The use of urea for the carbonate source makes it possible for a homogeneous reaction to proceed in the system by means of heating reaction or the like (this reaction is referred to as "homogeneous precipitation method"). Meanwhile, this reaction does not easily induce spontaneous production of cores because decomposition of the urea becomes a rate-limiting factor; however, in the case where seed crystals are used and particles are grown utilizing decomposition of urea in the stage of growing these seed crystals as in the present invention, this reaction is favorable in terms of controlling the particle size and obtaining particles with high crystallinity.

A synthesis reaction of a carbonate using urea as the carbonate source is shown below. As to the decomposition reaction of the urea, the reaction formula varies depending upon whether the reaction solution is acid or alkaline. Specifically, since aqueous solution of urea is near neutral, the pH of the whole system varies according to the selection of the metal ion source and the addition of acid or alkali, and so the decomposition reaction of the urea varies.

First of all, in the acidic region, hydrolysis of the urea takes place as represented by Formula (1) below.

$(NH_2)_2CO + 3H_2O \rightarrow 2NH_4^+ + OH^- + CO_2$    Formula (1):

Meanwhile, in the alkaline region, hydrolysis of the urea takes place as represented by Formula (2) below.

$(NH_2)_2CO + 2OH^- \rightarrow CO_3^{2-} + 2NH_3$    Formula (2):

Subsequently, carbonate ions ($CO_3^{2-}$) generated in the hydrolysis represented by Formula (1) or (2) react, for example, with electrolytically dissociated strontium ions ($Sr^{2+}$) as represented by Formula (3) below, and strontium carbonate ($SrCO_3$) is synthesized as the carbonate.

$Sr^{2+} + CO_3^{2-} \rightarrow SrCO_3$    Formula (3):

The reaction temperature in the heating reaction is preferably 55° C. to 95° C., more preferably 70° C. to 90° C. When the reaction temperature is less than 55° C., the decomposition reaction of urea does not proceed smoothly.

The length of reaction time in the heating reaction is not particularly limited and can be suitably selected according to the purpose, but it is preferably 15 min to 360 min, more preferably 30 min to 240 min.

It is desirable that the heating reaction be conducted with stirring, preferably at a stirring speed of 500 rpm to 1,500 rpm.

It is desirable that the pH of the solution (reaction solution) be 10 or greater throughout the heating reaction. This is because the ph range where the solubility of carbonate is the lowest consists of pH values of 10 and greater.

In the present invention, when strontium hydroxide octahydrate, for example, is used as a metal ion source necessary to form the carbonate, the solution containing the $Sr^{2+}$ ion source is alkaline because the strontium hydroxide octahydrate is alkaline. However, the pH decreases, as the reaction (i.e. the reaction represented by Formula (2)) proceeds. Therefore, it is necessary to add an alkaline chemical at the time of the reaction between the carbonate source and the metal ion source. Here, it should be noted that the addition of this alkaline chemical has another effect. Since the reaction represented by Formula (2) proceeds rightward, the hydrolysis of urea is accelerated, and thus precipitate (carbonate particles) can be obtained with a high yield and in a short period of time.

The addition of the alkaline chemical is not particularly limited, as long as it takes place at the time of reaction between the carbonate source and the metal ion source. The alkaline chemical may be added into a solution to which the carbonate source and the metal ion source have already been added, or may be added independently.

The alkaline chemical is not particularly limited and can be suitably selected according to the purpose, with NaOH, KOH, LiOH, etc. being preferable as examples. The added amount of the alkaline chemical is preferably an amount with which the pH of the reaction solution can be kept at 10 or greater.

It is desirable that water be contained in the solution in which the metal ion source and the carbonate source react together. Therefore, it is desirable that the solution in which the metal ion source and the carbonate source react together be an aqueous solution.

Also, it is desirable that a solvent be contained in the solution for the purpose of lowering the solubility of crystals of the carbonate synthesized.

The solvent is not particularly limited and can be suitably selected according to the purpose, but it is preferably one selected from methanol, ethanol and isopropyl alcohol. Note that it is necessary to select an appropriate solvent in light of the boiling point of the solvent together with the reaction temperature selected for the decomposition reaction of urea.

The carbonate produced by the present invention's method for producing a carbonate has high crystallinity, hardly flocculates and has an average aspect ratio of greater than 2. It should be particularly noted that when the carbonate is formed from needle-shaped or rod-shaped particles, the carbonate offers less alignment inside a molded component, exhibits isotropy and is therefore useful as a plastic reinforcing material, friction material, heat insulating material, filter or the like.

—Physical Properties of Carbonate—

The carbonate produced by the present invention's method for producing a carbonate preferably has an average aspect ratio of 2 or greater, more preferably in the range of 3 to 20. When the average aspect ratio is less than 2, the carbonate crystals become nearly granular or nearly spherical, and alignment of the carbonate particles is less likely to occur due to the molecular alignment of transparent resin in the resins or no alignment occurs, which results in loss of effects of the present invention.

The aspect ratio denotes the ratio of the length of a carbonate particle to the diameter thereof, and the larger the aspect ratio is, the more favorable.

The average major axis is preferably 5 μm or less, more preferably 300 nm or less, even more preferably 200 nm or less. When the average major axis is greater than 5 μm, the transmittance is sometimes greatly reduced in the case where the carbonate product is added into an optical resin material.

Also, it is desirable that the carbonate of the present invention have small variations in size. The variation coefficient of the average major axis is preferably 50% or less, and the variation coefficient of the average minor axis is preferably 50% or less.

Here, the variation coefficient of the average major axis and that of the average minor axis, which are represented as the ratio of the standard deviation to the average value of the major axis and as the ratio of the standard deviation to the average value of the minor axis respectively, can be calculated using Mathematical Formula (1) below and are expressed as values that are made by multiplying 100 and the values yielded by Mathematical Formula (1) together.

$$\frac{1}{r} \times \left\{ \frac{1}{n-1} \sum_{i=1}^{n} (r_i - r)^2 \right\}^{\frac{1}{2}}$$ Mathematical Formula (1)

In Mathematical Formula (1), "r" represents the average value of the major axes, "n" represents the number of particles subjected to the measurement of the major axis, and "$r_i$" represents the major axis of the particle measured for an i-th time.

The value of n is defined as 100 or greater, preferably a number which is large enough, more preferably 200 or greater. When the value of n is less than 100, the coefficient cannot precisely reflect the dispersion of the particles.

The particle size, average aspect ratio and variation coefficient of the carbonate of the present invention can, for example, be measured as follows: well-dispersed carbonate particles are observed using a transmission electron microscope, the particles are photographed, the photographs of the particles are scanned in a scanner and saved as a graphic file, the particles in this graphic file are analyzed one by one using Image Analysis Type Particle Size Distribution Analysis Software MAC-VIEW Ver. 3 manufactured by Mountech Co. Ltd, and the data of the particles are gathered to calculate the particle size, average aspect ratio and variation coefficient of the carbonate. It goes without saying that if particle images obtained through the transmission electron microscope observation are already jpg images, data processing using the scanner is not necessary, in which case data of a graphic file are directly gathered for the calculation.

It is desirable that the carbonate have high crystallinity. Here, examples of conventional methods for confirming if the carbonate has high crystallinity include X-ray diffraction method. Whether or not the carbonate has high crystallinity can be confirmed by judging from the consistency of the peaks of corresponding single crystals, for example using X-ray Diffractometer RINT 1500 (radiation source: copper Kα, wavelength: 1.5418 Å) manufactured by Rigaku Corporation. It is also possible to evaluate the crystallinity of the carbonate by observing surfaces of particles with a microscope.

—Applications—

Since the carbonate produced by the present invention's method for producing a carbonate has an average aspect ratio of greater than 2, in other words the carbonate is not formed from spherical particles but formed from needle-shaped, rod-shaped, etc. particles, it is useful as a plastic reinforcing material, friction material, heat insulating material, filter or the like. It should be particularly noted that the carbonate in a composite material that has been subjected to deformation such as a drawn material makes it possible to improve the strength and optical properties thereof by the alignment of the particles.

When the carbonate (crystals) produced by the present invention's method for producing a carbonate is dispersed in an optical polymer having birefringence, and the carbonate and the optical polymer are subjected to a drawing process so as to align linking chains present in the optical polymer substantially parallel to the particles of the carbonate, the birefringence brought about by the alignment of the linking chains of the optical polymer can be offset by the birefringence of the carbonate.

The drawing process is not particularly limited and can be suitably selected according to the purpose, with uniaxial drawing being preferable as an example. Examples of the method of the uniaxial drawing include a method of drawing the carbonate and the optical polymer with a desired draw ratio using a drawing machine while heating them according to necessity.

Birefringent indexes specific to optical polymers having birefringence are as described on p. 29 in Evolving Transparent Resins—World of Sophisticated Optical Materials Challenging IT—First Edition, written by Fumio Ide, published by Kogyo Chosakai Publishing Inc. Specific examples of the birefringent indexes of the optical polymers having birefringence are shown in Table 2. Table 2 shows the fact that many of the optical polymers have positive birefringence. Additionally, when strontium carbonate is used as the carbonate and added, for example, to polycarbonate serving as the optical polymer, it is possible not only to offset the positive birefringence of the mixture and make the mixture have a birefringent index of zero but also to make it have negative birefringence. Hence, the carbonate produced in accordance with the present invention can be suitably used for optical components, especially optical elements to which polarizing property is important and for which high precision is required.

TABLE 2

| Polymer | Birefringent Index |
| --- | --- |
| Polystyrene | −0.10 |
| Polyphenylene ether | 0.21 |
| Polycarbonate | 0.106 |

TABLE 2-continued

| Polymer | Birefringent Index |
| --- | --- |
| Polyvinylchloride | 0.027 |
| Polymethyl methacrylate | −0.0043 |
| Polyethylene terephthalate | 0.105 |
| Polyethylene | 0.044 |

According to the present invention's method for producing a carbonate, a carbonate having orientation birefringence and an average aspect ratio of greater than 2 can be formed efficiently and easily. Furthermore, it is possible to control the size of carbonate particles and to obtain at high rates a carbonate having a constant particle size.

EXAMPLES

The following explains Examples of the present invention; however, it should be noted that the present invention is not confined to Examples in any way.

In each of Examples and Comparative Examples below, the yield was calculated by measuring the weight of dry particles finally obtained, with the theoretical yield being assumed to be 100%.

Also, the particle size, average aspect ratio and variation coefficient of carbonate crystals were calculated as follows: well-dispersed carbonate particles were observed using a transmission electron microscope (TEM), the particles were photographed, the photographed particles in a graphic file were analyzed one by one using Image Analysis Type Particle Size Distribution Analysis Software MAC-VIEW Ver. 3 manufactured by Mountech Co. Ltd, and the data of the particles were gathered to calculate the particle size, average aspect ratio and variation coefficient of the carbonate crystals.

Example 1

—Production of Seed Crystal—

A $Sr(OH)_2$ suspension was prepared by adding 9.96 g of $Sr(OH)_2 \cdot 8H_2O$ (produced by Kanto Chemical Co., Ltd) into 38.5 ml of purified water and 230.0 ml of methanol and stirring the mixture. Subsequently, a carbonate source solution was prepared by dissolving 9.80 g of ammonium carbonate (produced by Kanto Chemical Co., Ltd) in 1,000 ml of purified water.

The $Sr(OH)_2$ suspension was placed in a temperature-controlled bath and kept at 5° C., and while the rotational speed of stirring was kept at 700 rpm, 62.5 ml of the carbonate source solution was added via two nozzles at an adding rate of 0.30 ml/min. After completion of this addition, the particle dispersion solution thus obtained was subjected to centrifugation, the collected precipitate was repeatedly washed with water, and a $SrCO_3$ dispersion solution for seed crystals was prepared such that 0.92 g of $SrCO_3$ particles were contained in 496.4 ml of purified water, with the amount of the $SrCO_3$ particles being equivalent to the amount of those dried.

—Growth—

Into the obtained $SrCO_3$ dispersion solution for seed crystals were added 6.64 g of $Sr(OH)_2 \cdot 8H_2O$ and 32.00 g of NaOH granules, and the mixture was stirred. After 500 ml of 4M urea solution was mixed into the mixture, reaction was effected at 90° C. for 2 hr while the rotational speed of stirring was kept at 1,000 rpm. Note that the pH at the beginning of the reaction was 13.9 and the pH at the end of the reaction was 11.8.

Figure 1B:
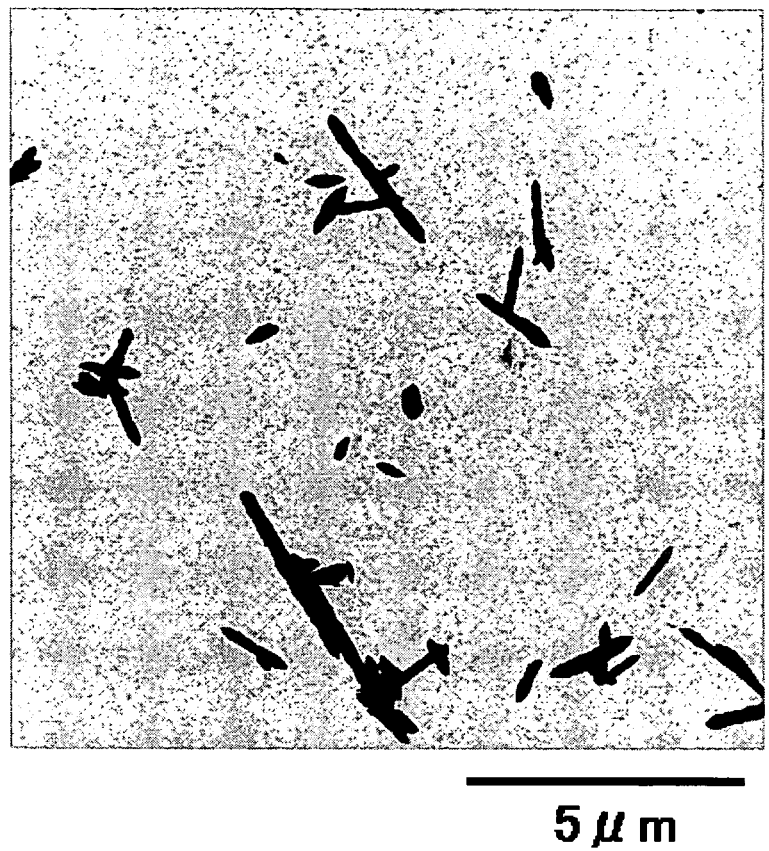
FIG. 1B is a TEM picture (at a 10,000-fold magnification) of a strontium carbonate produced in Example 1.

Part of the precipitate obtained was observed using a transmission electron microscope (TEM). The result is shown in FIGS. 1A and 1B. The rest of the precipitate was dried at 60° C. and pulverized and then was subjected to X-ray diffraction (XRD) measurement for identification of crystal phases. The result is shown in FIG. 2.

Judging from the TEM photographs in FIGS. 1A and 1B, it was found that the strontium carbonate particles obtained had an average aspect ratio of 9.3 and an average major axis of 3.4 µm.

Figure 2:
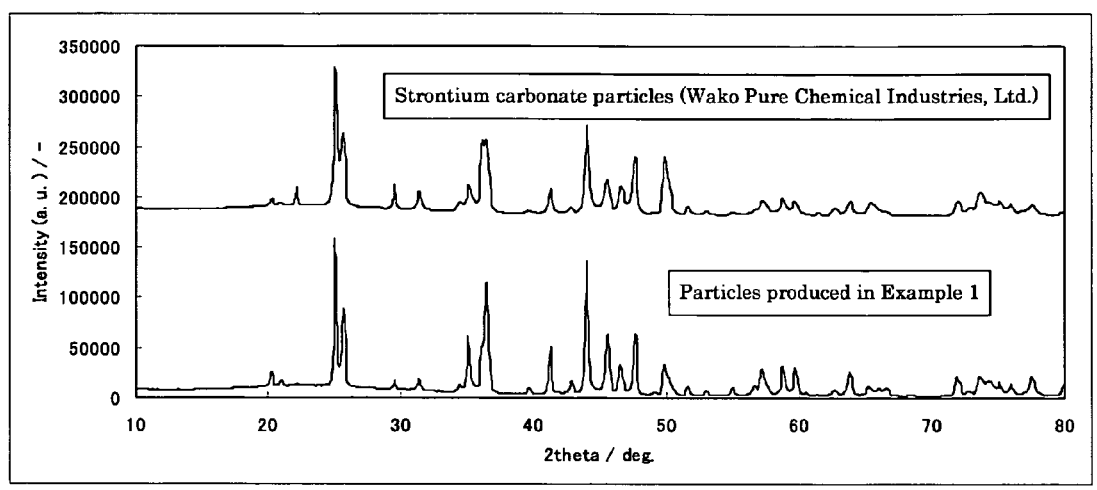
FIG. 2 shows results of X-ray diffraction (XRD) measurements carried out on particles produced in Example 1 and commercially available strontium carbonate particles.

Meanwhile, judging from the result of the X-ray diffraction (XRD) peaks shown in FIG. 2, it was found that the diffraction pattern was very sharp and that particles with favorable crystallinity, which are comparable with commercially-supplied products, were obtained.

The yield of the strontium carbonate of Example 1 was 96%.

Example 2

Strontium carbonate particles were obtained similarly to those of Example 1, except that the mass of $SrCO_3$ in the $SrCO_3$ dispersion solution for seed crystals was changed to 1.85 g. The pH at the beginning of the reaction was 14.0 and the pH at the end of the reaction was 10.4.

Figure 3A:
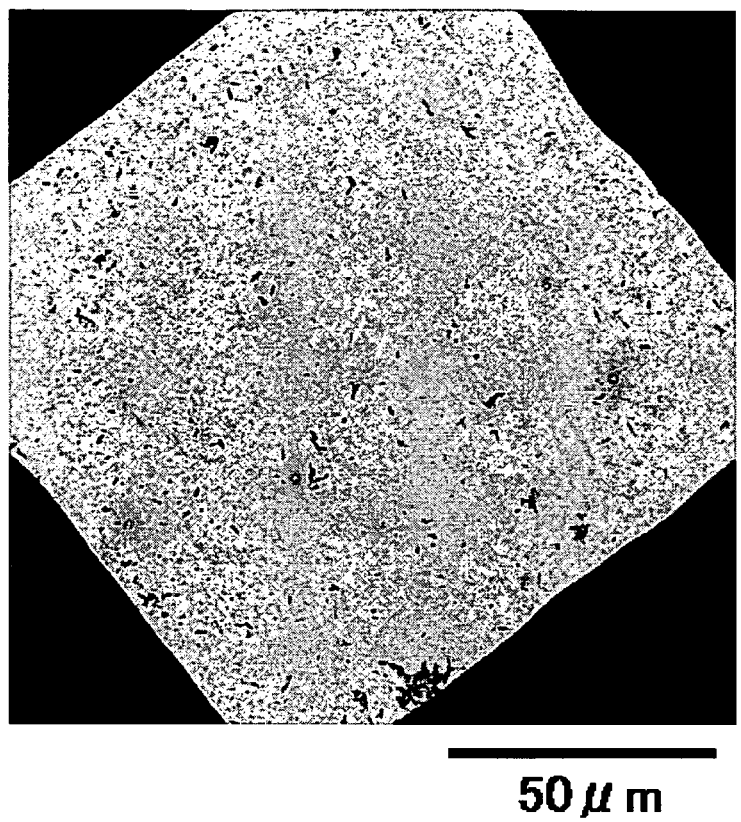
FIG. 3A is a TEM picture (at a 1,000-fold magnification) of a strontium carbonate produced in Example 2.
Figure 3B:
FIG. 3B is a TEM picture (at a 10,000-fold magnification) of a strontium carbonate produced in Example 2.

The strontium carbonate particles obtained were observed using a transmission electron microscope (TEM). The result is shown in FIGS. 3A and 3B. It was found that the strontium carbonate particles obtained had an average aspect ratio of 7.9 and an average major axis of 2.1 µm.

Meanwhile, an X-ray diffraction (XRD) measurement carried out on the obtained strontium carbonate particles revealed that they had high crystallinity.

The yield of the strontium carbonate particles of Example 2 was 100%.

Comparative Example 1

Firstly, 6.64 g of $Sr(OH)_2 \cdot 8H_2O$ and 32.00 g of NaOH granules were placed and then stirred. After 500 ml of 4M urea solution was mixed into the mixture, reaction was effected at 90° C. for 2 hr while the rotational speed of stirring was kept at 1,000 rpm. Note that the pH at the beginning of the reaction was 13.1 and the pH at the end of the reaction was 12.0.

Figure 4:
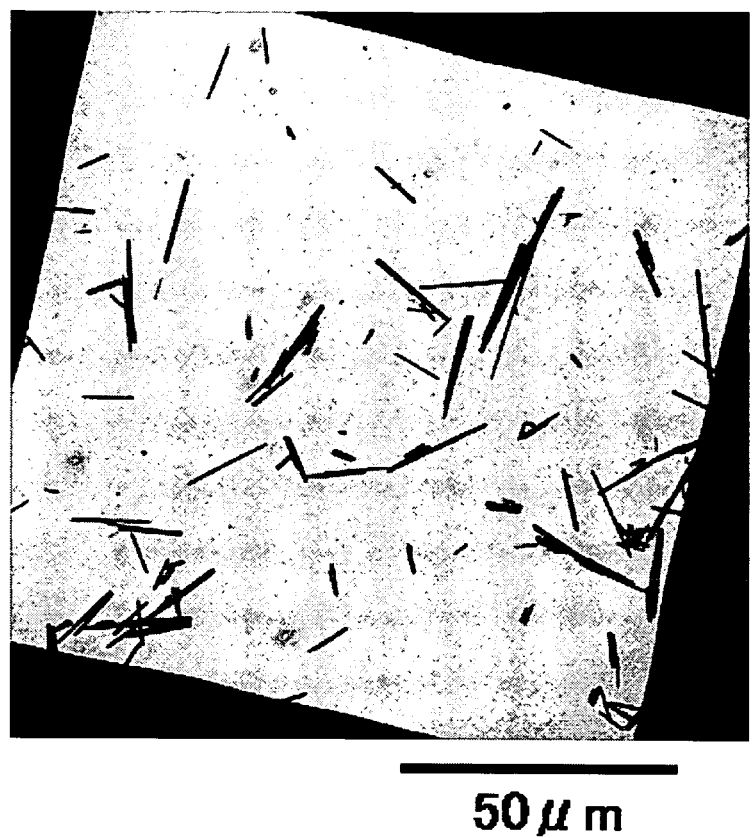
FIG. 4 is a TEM picture (at a 1,000-fold magnification) of a strontium carbonate produced in Comparative Example 1.

Part of the precipitate obtained was observed using a transmission electron microscope (TEM). The result is shown in FIG. 4. The rest of the precipitate was dried at 60° C. and pulverized and then was subjected to X-ray diffraction (XRD) measurement for identification of crystal phases.

Judging from the TEM photograph in FIG. 4, it was found that the strontium carbonate particles obtained had an average aspect ratio of 16.4 and an average major axis of 16.7 µm.

Meanwhile, an X-ray diffraction (XRD) measurement carried out on the obtained strontium carbonate particles revealed that they had high crystallinity.

The yield of the strontium carbonate particles of Comparative Example 1 was 92%.

Comparative Example 2

—Production of Carbonate—

A container which contained 10 ml of 0.01M strontium hydroxide [Sr(OH)$_2$] suspension (pH: 12.2) as a metal ion source-containing solution, and solid ammonium carbonate [(NH$_4$)$_2$CO$_3$] as a carbonate source were placed in an enclosed container. Then carbonate gas was generated from (NH$_4$)$_2$CO$_3$ and discharged into the gas phase inside the enclosed container. The carbonate gas discharged into the gas phase diffused slowly and dissolved in the strontium hydroxide [Sr(OH)$_2$] suspension. On this occasion, the strontium hydroxide [Sr(OH)$_2$] suspension was stirred and made to react with the carbonate gas at a reaction temperature of 25° C. for 360 min, and strontium carbonate crystals as the carbonate were thus obtained. The pH at the beginning of the reaction was 12.2 and the pH at the end of the reaction was 9.4, in other words a decrease in the pH of the strontium hydroxide [Sr(OH)$_2$] suspension owing to the dissolution of the carbonate gas was confirmed.

When the strontium carbonate particles obtained were observed using a transmission electron microscope (TEM), it was found that they had an average major axis of 470 nm. The average aspect ratio thereof ranged from 2 to 10.

Meanwhile, an X-ray diffraction (XRD) measurement carried out on the obtained strontium carbonate particles revealed that broadening of peaks was conspicuous in comparison with the XRD diffraction peaks of Example 1 and that SrCO$_3$ particles with reduced crystallinity were thus produced.

Moreover, the yield of the strontium carbonate particles of Comparative Example 2 did not even attain 20%.

The results of Examples 1 and 2 and Comparative Examples 1 and 2, and some other information are shown all together in Table 3 below.

TABLE 3

|  | Example 1 | Example 2 | Comparative Example 1 | Comparative Example 2 |
|---|---|---|---|---|
| Seed Crystal | SrCO$_3$ | SrCO$_3$ | none | none |
| Sr Source | Sr(OH)$_2$•8H$_2$O | Sr(OH)$_2$•8H$_2$O | Sr(OH)$_2$•8H$_2$O | Sr(OH)$_2$•8H$_2$O |
| Carbonate Source | urea | urea | urea | (NH$_4$)$_2$CO$_3$ |
| Reaction Temperature | 90° C. | 90° C. | 90° C. | 25° C. |
| pH in Reaction | 13.9→11.8 | 13.8→12.1 | 14.0→10.4 | 12.2→9.4 |
| Composition of Particle Obtained | SrCO$_3$ | SrCO$_3$ | SrCO$_3$ | SrCO$_3$ |
| TEM Photograph | FIG. 1A, FIG. 1B | FIG. 3A, FIG. 3B | FIG. 4 | not shown |
| Average Major Axis | 3.4 μm | 2.1 μm | 16.7 μm | 470 nm |
| Variation Coefficient of Major Axis (%) | 47.1 | 39.7 | 58.4 | 83.3 |
| Average Minor Axis | 366 nm | 266 nm | 1,018 nm | 135 nm |
| Variation Coefficient of Minor Axis (%) | 30.5 | 35.5 | 38.0 | 46.2 |
| Average Aspect Ratio | 9.3 | 7.9 | 16.4 | 2 to 10 |
| Yield (%) | 96 | 100 | 92 | less than 20% |

Note that "Sr source", "Carbonate source", "Reaction Temperature" and "pH" of Examples 1 and 2 in Table 3 are connected with the step of growing seed crystals.

The present invention's method for producing a carbonate makes it possible to control the size of carbonate particles and to efficiently and easily produce at high rates a carbonate having a constant particle size.

The carbonate produced by the present invention's method for producing a carbonate has high crystallinity, hardly flocculates and has an aspect ratio of greater than 2 (carbonate particles are shaped like needles or rods in particular). Therefore, the carbonate offers less alignment inside a molded component, exhibits isotropy and can therefore be suitably used for plastic reinforcing materials, friction materials, heat insulating materials, filters and the like. It should be particularly noted that the carbonate in a composite material that has been subjected to a deformation such as drawing makes it possible to improve the strength and optical properties thereof by the alignment of the particles.

When the carbonate (crystals) produced by the present invention's method for producing a carbonate is dispersed in an optical polymer having birefringence, and the carbonate and the optical polymer are subjected to a drawing process so as to align linking chains present in the optical polymer substantially parallel to the particles of the carbonate, the birefringence brought about by the alignment of the linking chains of the optical polymer can be offset by the birefringence of the carbonate. Hence, the carbonate can be suitably used for optical components, especially optical elements to which polarizing property is important and for which high precision is required.

What is claimed is:

1. A method for producing a carbonate, comprising:
    adding a metal ion source to a dispersion comprising seed crystals to prepare a mixture of the metal ion source and the seed crystals,
    adding a carbonate source to the mixture to obtain a reaction solution, and
    growing the seed crystals in the reaction solution,
    wherein the seed crystals are strontium carbonate particles,
    wherein the carbonate source comprises urea and wherein the step of growing the seed crystals is carried out at a pH of 10 or greater throughout.

2. The method for producing a carbonate according to claim 1, wherein the metal ion source is a hydroxide of strontium.

3. The method for producing a carbonate according to claim 1, wherein the step of growing the seed crystals is carried out at 55° C. to 95° C.

* * * * *